United States Patent
Shigenobu

(10) Patent No.: US 12,130,562 B2
(45) Date of Patent: Oct. 29, 2024

(54) METHOD OF OBTAINING ARRAY OF PLURALITY OF REGIONS ON SUBSTRATE, EXPOSURE APPARATUS, METHOD OF MANUFACTURING ARTICLE, NON-TRANSITORY STORAGE MEDIUM, AND INFORMATION PROCESSING APPARATUS

(71) Applicant: CANON KABUSHIKI KAISHA, Tokyo (JP)

(72) Inventor: Atsushi Shigenobu, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 534 days.

(21) Appl. No.: 17/587,137

(22) Filed: Jan. 28, 2022

(65) Prior Publication Data
US 2022/0269187 A1    Aug. 25, 2022

(30) Foreign Application Priority Data
Feb. 22, 2021  (JP) .................... 2021-026641

(51) Int. Cl.
*G03F 7/20* (2006.01)
*G03F 9/00* (2006.01)

(52) U.S. Cl.
CPC .......... *G03F 9/7011* (2013.01); *G03F 9/7019* (2013.01)

(58) Field of Classification Search
CPC .... G03F 9/7011; G03F 9/7019; G03F 9/7003; G03F 9/7046; G03F 9/7088; G03F 7/70775; G03F 9/7092; G06F 17/16; G06F 17/18; H01L 21/0274
See application file for complete search history.

(56) References Cited

U.S. PATENT DOCUMENTS 10,908,513 B2    2/2021    Noot et al.
11,079,684 B2    8/2021    Bijnen et al.
(Continued)

FOREIGN PATENT DOCUMENTS

| JP | S6144429 A | 3/1986 |
| JP | S6284516 A | 4/1987 |
| JP | H06349705 A | 12/1994 |

(Continued)

OTHER PUBLICATIONS

Office Action issued in Taiwanese Appln. No. 111102527 mailed on Jan. 12, 2024. English translation provided.

*Primary Examiner* — Mesfin T Asfaw
(74) *Attorney, Agent, or Firm* — ROSSI, KIMMS & McDOWELL LLP

(57) ABSTRACT

The preset invention provides a method of obtaining an array of a plurality of regions on a substrate, including obtaining, using a prior distribution representing a probability distribution of parameters of a regression model used to estimate the array, a first posterior distribution representing the probability distribution of the parameters, obtaining, using the first posterior distribution as the prior distribution representing the probability distribution of the parameters, a second posterior distribution representing the probability distribution of the parameters, and updating the regression model by deciding the parameters based on the second posterior distribution and obtaining, using the updated regression model, the array of the plurality of regions on a substrate from the second position measurement data.

14 Claims, 6 Drawing Sheets

(56) References Cited

U.S. PATENT DOCUMENTS 11,281,113 B2    3/2022   Li et al.
11,442,368 B2    9/2022   Quintanilha et al.

FOREIGN PATENT DOCUMENTS

| | | |
|---|---|---|
| JP | 3230271 B2 | 11/2001 |
| TW | 201921127 A | 6/2019 |
| TW | 201935150 A | 9/2019 |
| TW | 201945863 A | 12/2019 |
| TW | 202004359 A | 1/2020 |

METHOD OF OBTAINING ARRAY OF PLURALITY OF REGIONS ON SUBSTRATE, EXPOSURE APPARATUS, METHOD OF MANUFACTURING ARTICLE, NON-TRANSITORY STORAGE MEDIUM, AND INFORMATION PROCESSING APPARATUS

BACKGROUND OF THE INVENTION

Field of the Invention

The present invention relates to a method of obtaining an array of a plurality of regions on a substrate, an exposure apparatus, a method of manufacturing an article, a non-transitory storage medium, and an information processing apparatus.

Description of the Related Art

An exposure apparatus overlays 10 or more layers of patterns (circuit patterns) and transfers these to a substrate. If the overlay accuracy of the patterns between the layers is not high, inconvenience may occur in the circuit characteristic. In this case, a chip cannot satisfy a predetermined characteristic and becomes defective, resulting in a low yield. It is therefore necessary to accurate position (align) each of the plurality of regions to be exposed and the pattern of an original on the substrate.

In the exposure apparatus, an alignment mark arranged in each region on the substrate is detected, and each region on the substrate is aligned with the pattern of the original based on the position information of the alignment mark and the position information of the pattern of the original. Ideally, when alignment mark detection is performed for all regions on the substrate, most accurate alignment can be performed. However, this is not realistic from the viewpoint of productivity. As disclosed in Japanese Patent Laid-Open No. S61-44429 or S62-84516, the current mainstream of an alignment method for a substrate and an original is a global alignment method.

In the global alignment method, assuming that the relative position of each region on a substrate can be expressed by a function model of the position coordinates of the region, the positions of alignment marks arranged only in a plurality of (4 to 16) sample regions on the substrate are measured. Next, the parameters of the function model are estimated, using regression analysis-like statistic operation processing, from the assumed function model and the measurement result of the alignment mark positions. Using the parameter and the function model, the position coordinates of each region on a stage coordinate system (the array of the regions on the substrate) are calculated, thereby performing alignment. As disclosed in Japanese Patent Laid-Open No. H6-349705, in the global alignment method, a polynomial model using stage coordinates as variables is used in general, and scaling that is a first-order polynomial of stage coordinates, rotation, uniform offset, and the like are mainly used. A technique using a regression model that considers, as a parameter, even a high-order component of the array of regions on the substrate is also proposed in Japanese Patent No. 3230271.

Along with the progress of miniaturization and integration of devices, the alignment accuracy is required to be improved. For this reason, the degree of freedom of the function model needs to be increased by using a higher-order component as the degree of the polynomial of the function model. However, if the number of measurement points to measure the positions of alignment marks in a substrate is small relative to the degree of freedom of the function model, overfitting occurs, and correction errors of unmeasured regions increase. On the other hand, if the number of measurement points to measure the positions of alignment marks is increased to suppress the overfitting, the measurement time increases, and the productivity lowers. Since these have a tradeoff relationship, there is demanded a technique capable of accurately predicting the array of regions on a substrate including a high-order component using a small number of measurement points and a function model of a high degree of freedom.

SUMMARY OF THE INVENTION

The present invention provides a technique advantageous in accurately obtaining the array of regions on a substrate.

According to one aspect of the present invention, there is provided a method of obtaining an array of a plurality of regions on a substrate, including obtaining, using a prior distribution representing a probability distribution of parameters of a regression model used to estimate the array, a first posterior distribution representing the probability distribution of the parameters from first position measurement data of marks assigned to a first number of sample regions in the plurality of regions on a first substrate, obtaining, using the first posterior distribution as the prior distribution representing the probability distribution of the parameters, a second posterior distribution representing the probability distribution of the parameters from second position measurement data of marks assigned to a second number of sample regions in a plurality of regions on a second substrate to be processed after the first substrate, the second number being smaller than the first number, and updating the regression model by deciding the parameters based on the second posterior distribution and obtaining, using the updated regression model, the array of the plurality of regions on the second substrate from the second position measurement data.

Further aspects of the present invention will become apparent from the following description of exemplary embodiments with reference to the attached drawings.

DESCRIPTION OF THE EMBODIMENTS

Figure 1:
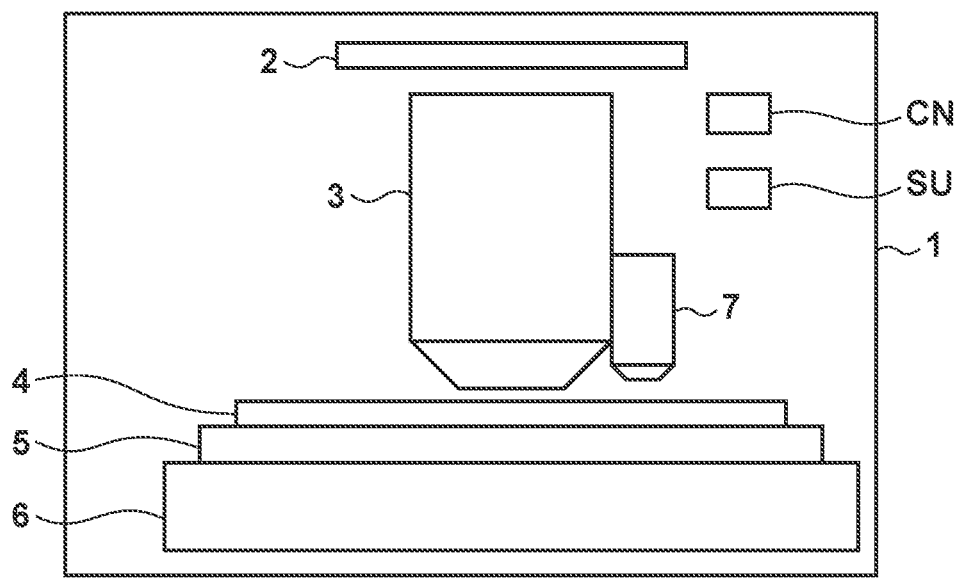
FIG. 1 is a schematic view showing the configuration of an exposure apparatus according to one aspect of the present invention.

Hereinafter, embodiments will be described in detail with reference to the accompanying drawings. It should be noted that the following embodiments are not intended to limit the scope of the appended claims. In the embodiments, a plurality of features are described. Not all of the plurality of feature are necessarily essential to the present invention, and the plurality of features may arbitrarily be combined. Also, the same reference numerals denote the same or similar parts throughout the accompanying drawings, and a repetitive description will be omitted.

FIG. 1 is a schematic view showing the configuration of an exposure apparatus 1 according to one aspect of the present invention. The exposure apparatus 1 is a lithography apparatus used in the manufacturing process of a device such as a semiconductor element. In this embodiment, the exposure apparatus 1 projects the pattern of an original 2 (a reticle or a mask) onto a substrate 4 via a projection optical system 3, and exposes the substrate 4.

As shown in FIG. 1, the exposure apparatus 1 includes the projection optical system 3 that projects (reduction-projects) a pattern formed on the original 2, and a chuck 5 that holds the substrate 4 on which a base pattern or an alignment mark is formed by a preprocess. The exposure apparatus 1 also includes a substrate stage 6 that holds the chuck 5 and positions the substrate 4 at a predetermined position, an alignment optical system 7 that measures the position of an alignment mark provided on the substrate 4, a control unit CN, and a storage unit SU.

The control unit CN is formed by, for example, a computer (information processing apparatus) including a CPU, a memory, and the like, and generally controls the units of the exposure apparatus 1 in accordance with a program stored in the storage unit SU or the like. In this embodiment, in addition to controlling exposure processing of exposing the substrate 4 via the original 2, the control unit CN functions as a processing unit configured to obtain an array (a shot array or a region array) of a plurality of shot regions on the substrate (a plurality of regions on the substrate).

The storage unit SU stores a program and various kinds of information (data) necessary to execute exposure processing of exposing the substrate 4 by controlling the units of the exposure apparatus 1. The storage unit SU also stores a program and various kinds of information (data) necessary for the control unit CN to obtain a shot array.

Figure 2:
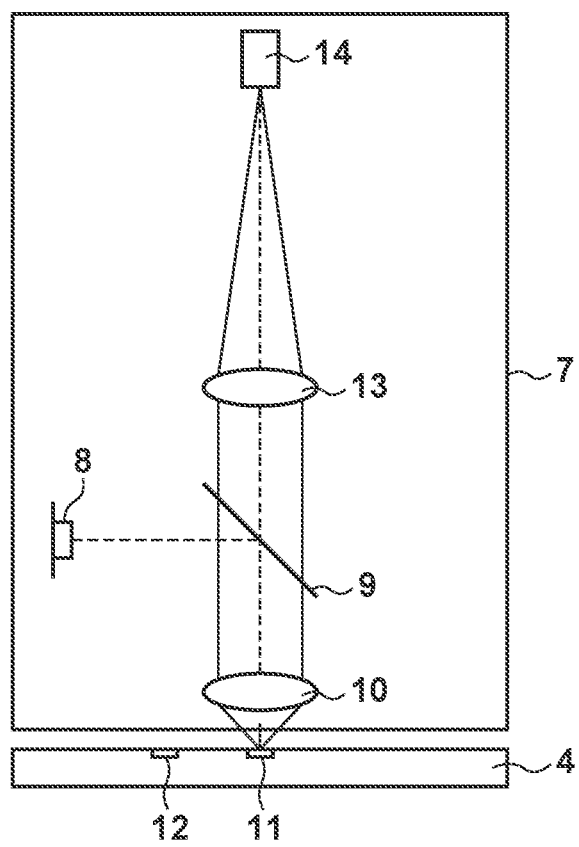
FIG. 2 is a schematic view showing the configuration of the alignment optical system of the exposure apparatus shown in FIG. 1.

FIG. 2 is a schematic view showing the configuration of the alignment optical system 7. The alignment optical system 7 has a function of optically detecting a mark assigned to each shot region on the substrate 4 and acquiring position measurement data, and, in this embodiment, includes a light source 8, a beam splitter 9, lenses 10 and 13, and a sensor 14.

Light from the light source 8 is reflected by the beam splitter 9 and illuminates, via the lens 10, an alignment mark 11 or 12 provided on the substrate 4. The light diffracted by the alignment mark 11 or 12 is received by the sensor 14 via the lens 10, the beam splitter 9, and the lens 13.

Figure 3:
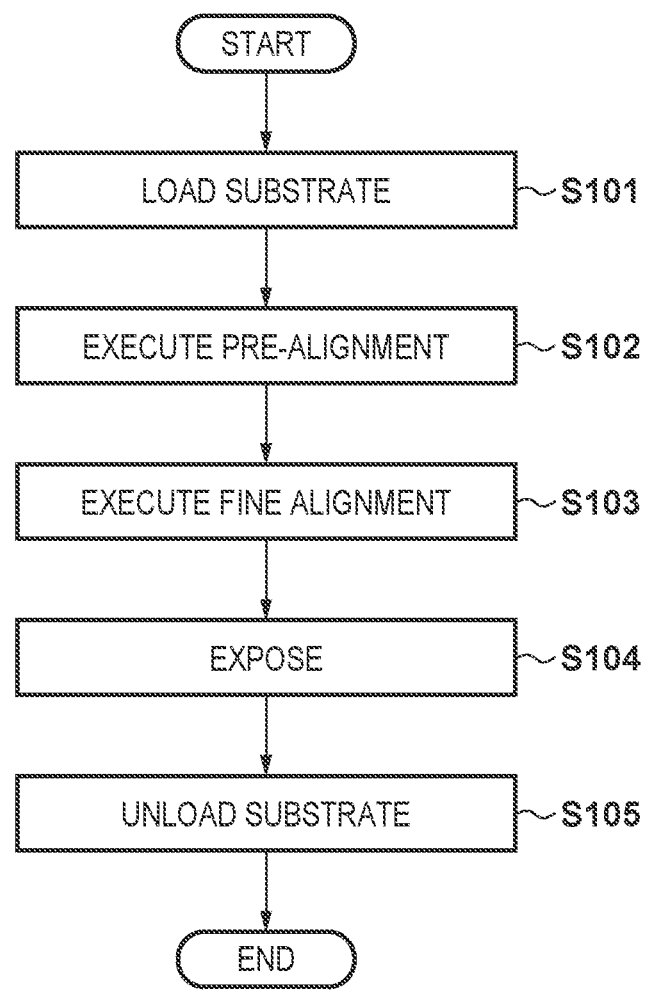
FIG. 3 is a flowchart for explaining exposure processing of the exposure apparatus shown in FIG. 1.

Exposure processing by the exposure apparatus 1 will be described with reference to FIG. 3. The outline of processes until the substrate 4 is aligned and exposed will be described here. In step S101, the substrate 4 is loaded into the exposure apparatus 1. In step S102, pre-alignment is executed. More specifically, the alignment mark 11 for pre-alignment provided on the substrate 4 is detected by the alignment optical system 7, thereby roughly obtaining the position of the substrate 4. At this time, detection of the alignment mark 11 is performed for a plurality of shot regions on the substrate 4, and the shift and the first-order linear component (magnification or rotation) of the entire substrate 4 are obtained.

In step S103, fine alignment is executed. More specifically, first, based on the result of pre-alignment, the substrate stage 6 is driven to a position where the alignment mark 12 for fine alignment can be detected by the alignment optical system 7. Then, the alignment mark 12 provided in each of the plurality of shot regions on the substrate 4 is detected by the alignment optical system 7, thereby accurately obtaining the shift and the first-order linear component (magnification or rotation) of the entire substrate 4. At this time, the high-order deformation component of the substrate 4 can accurately be obtained by obtaining the positions of a number of shot regions. This makes it possible to obtain the accurate position of each shot region on the substrate 4, that is, the shot array.

In step S104, the substrate 4 is exposed. More specifically, after the fine alignment is executed, the pattern of the original 2 is transferred to each shot region on the substrate 4 via the projection optical system 3. In step S105, the substrate 4 is unloaded from the exposure apparatus 1.

In this embodiment, if a distortion occurs in the substrate 4, the high-order deformation component is corrected in the fine alignment of step S103. As a regression model for estimating the shot array, a cubic polynomial model will be described as an example. However, the present invention is not limited to this. For example, as the regression model, an arbitrary degree model may be used, or a model (a triangle function model or a logarithmic model) other than a polynomial may be used.

If the deformation of the substrate 4 is expressed by a cubic polynomial model, the position deviations (ShiftX, ShiftY) of each shot region are represented by equations (1) below. Note that a position deviation of each shot region can also be considered as a correction value used to correct the position deviation.

$$\text{Shift}X = k_1 + k_3 x + k_5 y + k_7 x^2 + k_9 xy + k_{11} y^2 + k_{13} x^3 + k_{15} x^2 y + k_{17} xy^2 + k_{19} y^3$$

$$\text{Shift}Y = k_2 + k_4 y + k_6 x + k_8 y^2 + k_{10} xy + k_{12} x^2 + k_{14} y^3 + k_{16} xy^2 + k_{18} x^2 y + k_{20} x^3 \quad (1)$$

where x and y are the positions (explanatory variables) of a shot region on the substrate 4. Coefficients $k_1$ to $k_{20}$ in equations (1) are decided from the actual position measurement data of each shot region on the substrate 4. Then, the position deviation of each shot region is obtained based on equations (1) in which the coefficients are decided.

Figure 4:
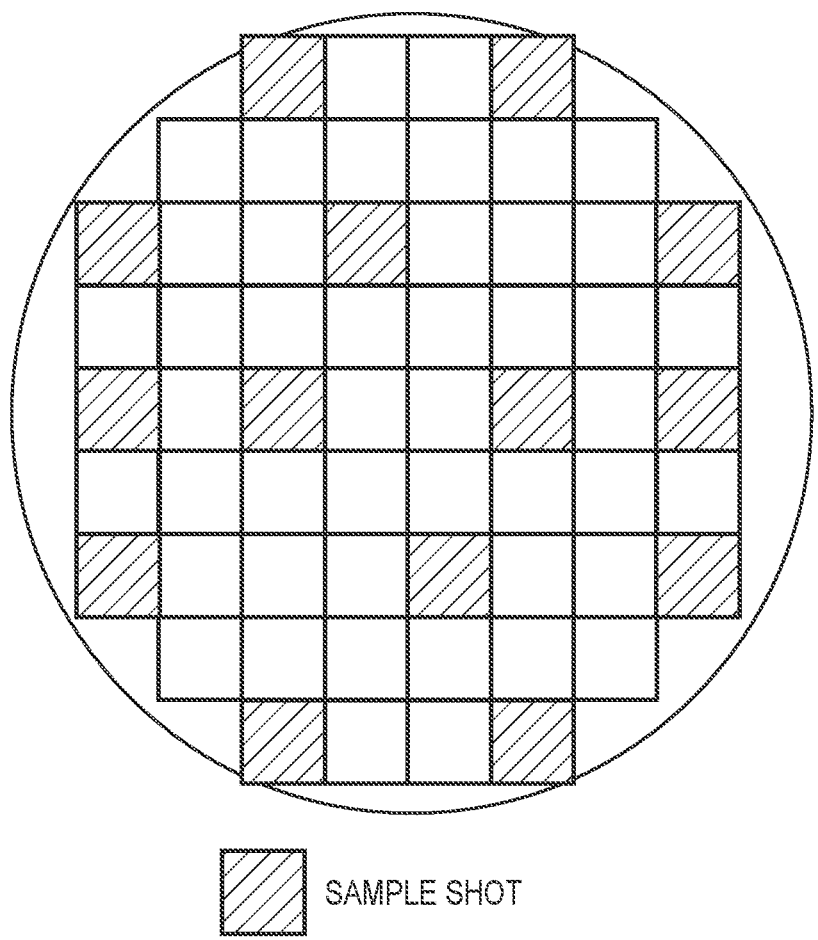
FIG. 4 is a view showing the array of shot regions on a substrate.

To obtain the position measurement data, for example, as shown in FIG. 4, the alignment optical system 7 detects alignment marks assigned to some shot regions, that is, so-called sample shot regions (sample regions) of a plurality of shot regions. In FIG. 4, the number of sample shot regions is 14. To correct the high-order deformation component of the substrate 4, a lot of shot regions need to be set to sample shot regions. However, an increase in the number of sample shot regions and the measurement time (alignment time) have a tradeoff relationship. Hence, in fact, the number of sample shot regions is decided in consideration of the productivity of devices.

Optimization of the parameter of a model configured to estimate a shot array (updating of a model) in this embodiment will be described below with reference to FIG. 5.

First, for a first substrate 4A (first substrate) in a lot, the number of sample shot regions is set to a number (first number) that does not cause overfitting for the degree of freedom of the model and sufficient for the degree of freedom of the model. Then, an alignment mark assigned to each sample shot region on the substrate 4A is detected by the alignment optical system 7, thereby acquiring first position measurement data.

Next, from the first position measurement data (D), the model, and parameters θ of the model, a data likelihood (first likelihood data) P(D|θ) is calculated. The parameter θ means the coefficients $k_1$ to $k_{20}$ of equations (1).

Next, the prior distribution P(θ) of the parameters θ is defined. As for the prior distribution, if there is no prior information for the data, a non-informative prior distribution is defined as the prior distribution P(θ). As the non-informative prior distribution, a uniform distribution, a normal distribution in which the variance is set large, a Jeffreys prior distribution, or the like is typically used.

Next, using the prior distribution P(θ) and the data likelihood P(D|θ), a posterior distribution (first posterior distribution) p(θ|D) of the parameters θ is calculated by Bayesian inference using the Bayes' theorem. Note that the Bayes' theorem is expressed by $$p(\theta|D) = \frac{p(D|\theta)_{p(\theta)}}{p(D)} \quad (2)$$

where θ is a parameter of the model, D is the position measurement data, and p(θ|D) is the posterior distribution of the parameters θ when new position measurement data is obtained. In addition, p(D|θ) is a data likelihood (likelihood function) representing the probability that data is generated from the parameters θ, p(θ) is the prior distribution of the parameters θ, and p(D) is the peripheral likelihood of the position measurement data D.

Note that when calculating the posterior distribution p(θ|D), if the peripheral likelihood p(D) cannot analytically be calculated, approximate reasoning may be used. The approximate reasoning includes, for example, a Markov Chain Monte Carlo (MCMC) method that is a sampling method, and variational inference for performing analytical calculation using an approximate probability distribution. The posterior distribution p(θ|D) is a probability distribution (the probability distribution of the parameters of the model) decided by the model set by the designer. As the characteristic feature of the Bayesian inference, the variance of the distribution is interpreted as the "certainty" of the value of each parameter. Note that in this embodiment, the model is a polynomial model having substrate coordinates (the position of the substrate) as variables, and there are 10 parameters for each of ShiftX and ShiftY.

Next, for a second or subsequent substrate 4B (a second substrate to be processed after the first substrate) in the lot, the number of sample shot regions is set to a number (second number) smaller than the number of sample shot regions set for the substrate 4A. Then, an alignment mark assigned to each sample shot region on the substrate 4B is detected by the alignment optical system 7, thereby acquiring second position measurement data.

Here, for example, in the cubic polynomial model, if the number of sample shot regions on the substrate 4A is set to 16, the number of sample shot regions on the substrate 4B is set to 4 to 8. If the number of sample shot regions for the cubic polynomial model is 4 to 8, the possibility that overfitting occurs becomes very high because the number of measurement points for the degree of freedom of the model is small. To suppress the overfitting, the following processing is executed in this embodiment.

Figure 6:
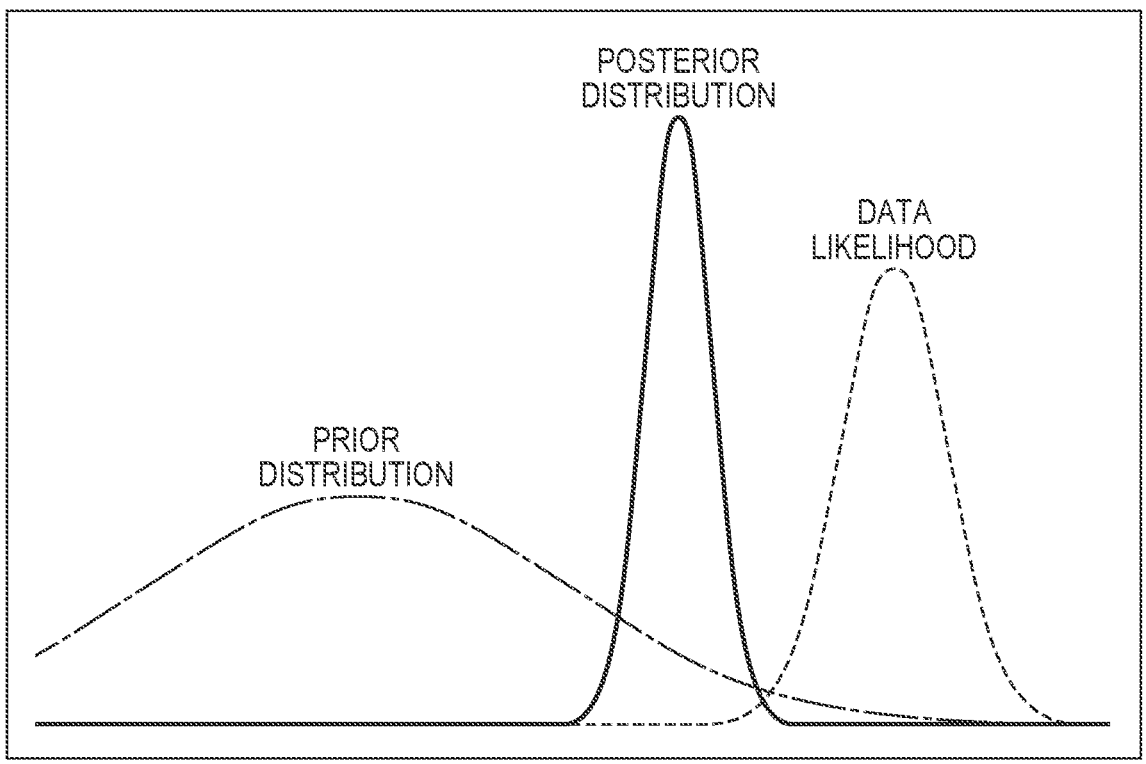
FIG. 6 is a view for explaining optimization of the parameters of a model configured to estimate a shot array.

From the second position measurement data (D), the model, and the parameters θ of the model, a data likelihood (second likelihood data) P(D|θ) is calculated. The posterior distribution p(θ|D) obtained for the substrate 4A is set to (replaced with) the prior distribution P(θ), and using the data likelihood P(D|θ) calculated from the second position measurement data, a posterior distribution (second posterior distribution) p(θ|D) is calculated by Bayesian inference using the Bayes' theorem. As shown in FIG. 6, this posterior distribution p(θ|D) is a distribution (posterior distribution) in which the distribution (prior distribution) obtained from the first position measurement data (multipoint data) and the distribution (data likelihood) obtained from the second position measurement data (small number of data) are mixed. If the shapes of the distortions of the substrates in the lot are approximate, the distribution obtained in this way is expected to be closer to the actual distortion amount of the substrate than the distribution obtained by only the second position measurement data. The actual position deviations (ShiftX, ShiftY) of each shot region are calculated by statistical estimation from the defined model based on a statistic value such as the mode, the average value, or the median of the posterior distribution of the parameters θ.

When the model is updated by deciding the parameters of the model based on the thus calculated posterior distribution, and the position deviation (shot array) of each shot region on the substrate 4B is obtained from the second position measurement data using the updated model, a high-order deformation component can be corrected.

According to this embodiment, in the first substrate, the number of sample shot regions to be set needs to be sufficient for the degree of freedom of the model. However, in the second or subsequent substrate, it is possible to decrease the number of sample shot regions while suppressing overfitting. Also, if the variation of distortion is large between the substrates in the lot, a posterior distribution obtained, for a plurality of substrates, by setting the number of sample shot regions sufficient for the degree of freedom of the model may be used as the prior distribution for the subsequent substrates.

When a linear regression model of a polynomial is used as the model, and a multivariate normal distribution is used as the prior distribution, the posterior distribution can analytically be solved. For example, assume that ShiftX that is a deformation component of a substrate is modeled by a polynomial shown by equation (1). A design matrix G (a matrix of a measurement data count x and a parameter count) to be used in multivariate regression analysis is created from the polynomial model and the measured positions (x, y) of the substrate, the position measurement data is set to y (the vector of the measurement data count), and the error variance of the position measurement data is set to a. In this case, based on the theorem of statistical regression analysis, the data likelihood P(D|θ) for the set D of position measurement data and the parameters θ of the model is expressed by $$p(D|\theta) \propto \exp\left\{-\frac{1}{2\sigma^2}(y - G\theta)^T(y - G\theta)\right\} \quad (3)$$

Also, assume that the prior distribution P(θ) complies with a multivariate normal distribution, as indicated by $$p(\theta) \propto \exp\left\{-\frac{1}{2\sigma^2}(\theta - \mu_0)^T \sum\nolimits_0^{-1} (\theta - \mu_0)\right\} \quad (4)$$

where $\mu_0$ is the mean vector, and $\Sigma_0$ is the variance-covariance matrix. Hence, the posterior distribution $p(\theta|)$ is given by $$p(\theta \mid D) \propto \exp\left\{-\frac{1}{2}\left(\frac{1}{\sigma^2}(y - G\theta)^T(y - G\theta) + (\theta - \mu_0)^T \sum_0^{-1}(\theta - \mu_0)\right)\right\} \quad (5)$$

When expression (5) is arranged, it is derived that expression (5) complies with the multivariate normal distribution, as indicated by $$\sum^{-1} = \frac{1}{\sigma^2}G^T G + \sum_0^{-1} \quad \mu = \sum\left(\frac{1}{\sigma^2}G^T y + \sum_0^{-1} \mu_0\right) \quad (6)$$

Equations (6) are the parameters of the multivariate normal distribution derived from expression (5), in which $\mu$ is the mean vector (mean vector $\mu$) of the posterior distribution, and $\Sigma$ is the variance-covariance matrix (variance-covariance matrix $\Sigma$) of the posterior distribution.

Figure 5:
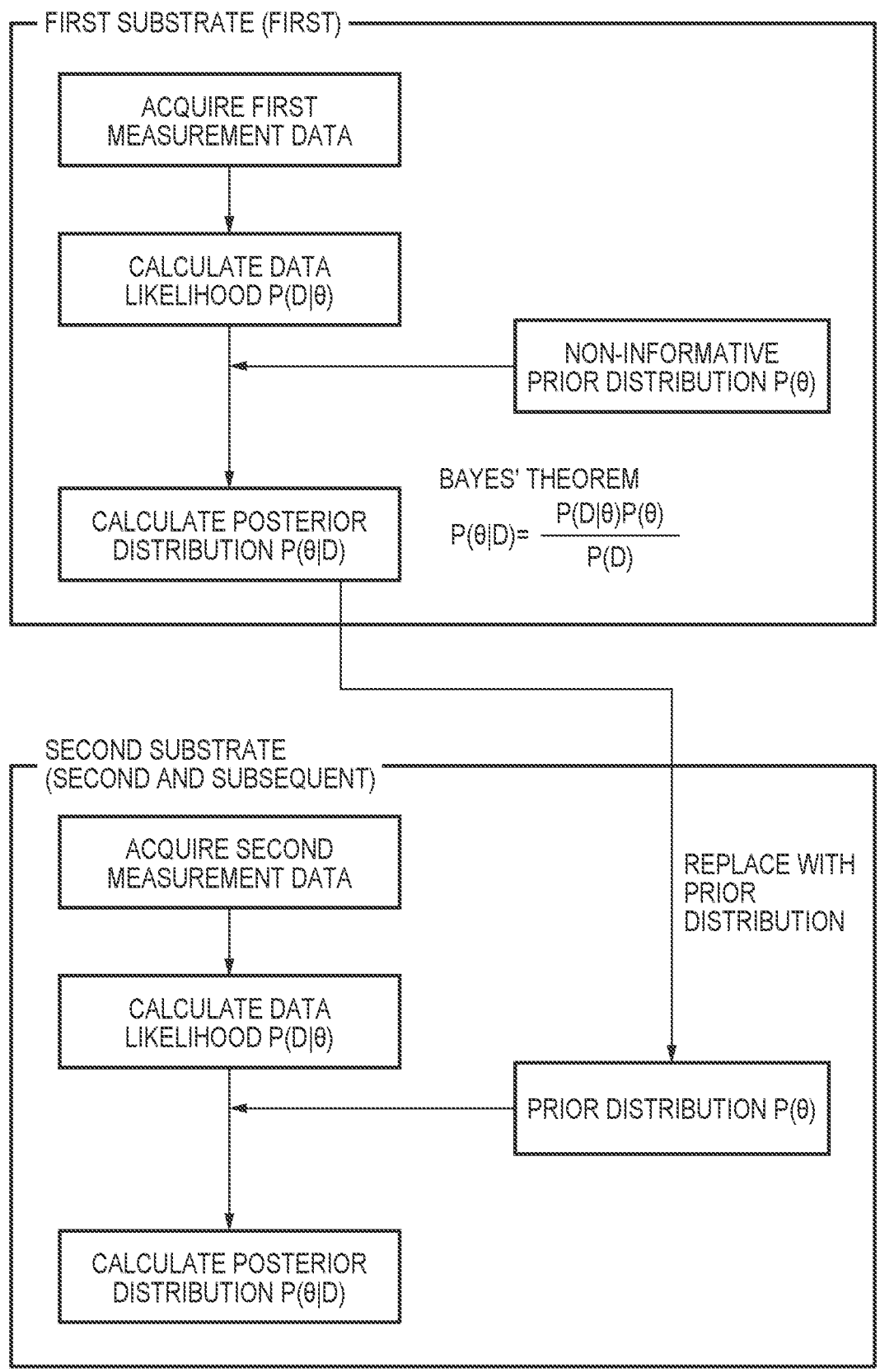
FIG. 5 is a view for explaining optimization of the parameters of a model configured to estimate a shot array.

When expressions (3), (4), (5), and (6) are sequentially calculated in accordance with the sequence shown in FIG. 5, optimum parameters of the model can be calculated. However, for the first substrate, it is necessary to use a non-informative prior distribution, set $\mu_0$ to a zero vector, and set, as a variance-covariance matrix, a symmetrical matrix in which diagonal components have large values, and the remaining components are zero.

Figure 7A:
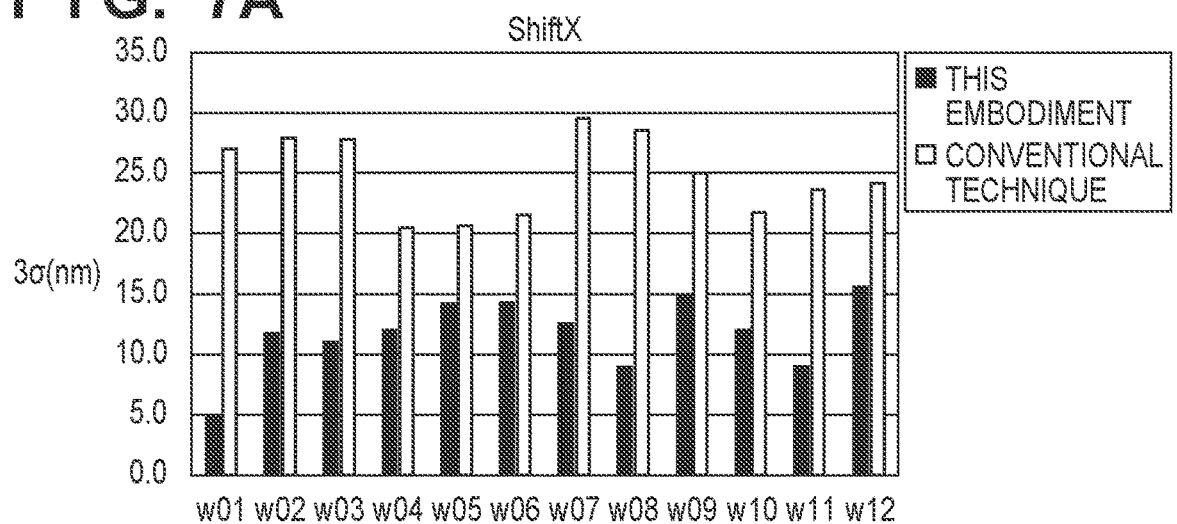
FIGS. 7A to 7C are views showing the result of applying the sequence shown in FIG. 5 to an actual process.
Figure 7B:
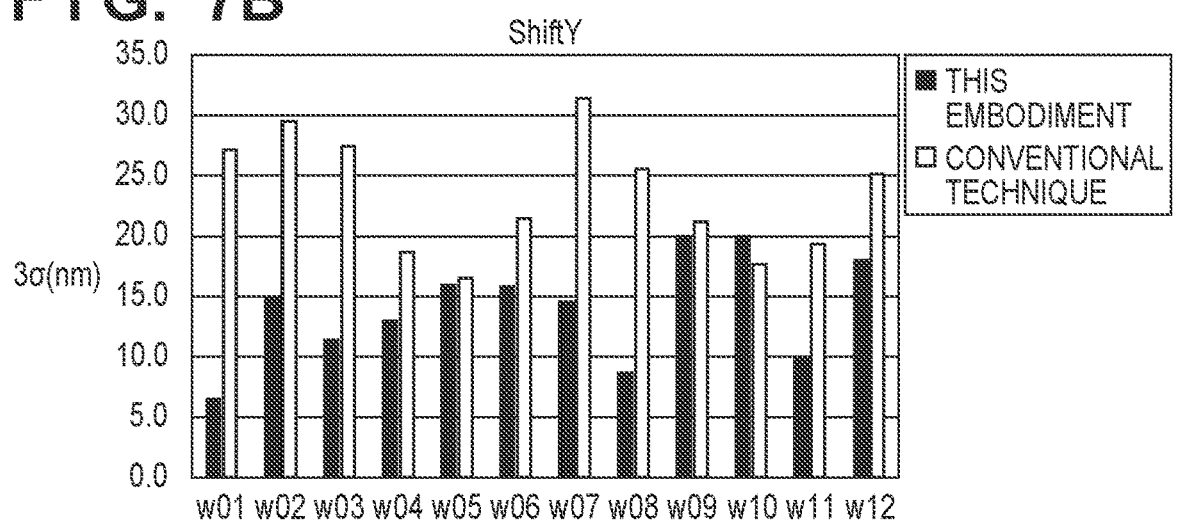
Figure 7C:
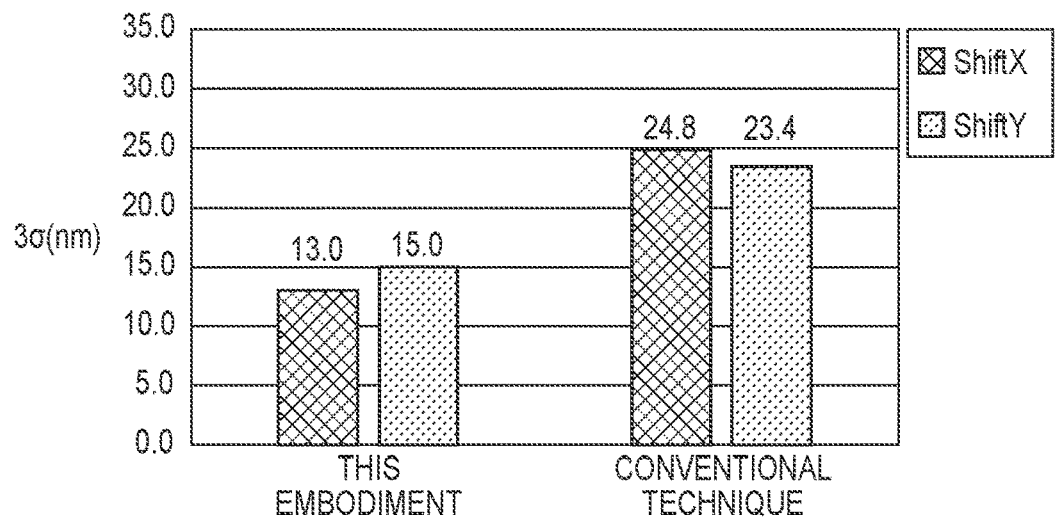

A result of applying the sequence shown in FIG. 5 to an actual process will be described with reference to FIGS. 7A, 7B, and 7C. Here, 12 process substrates were used for evaluation. For the first substrate, the number of sample shot regions was set to 36, and the posterior distribution $p(\theta|D)$ of parameters was calculated using a quintic polynomial. For the second and subsequent substrates, the number of sample shot regions was decreased to 8, the posterior distribution calculated for the first substrate was set to the prior distribution, the posterior distribution was calculated for each substrate from the data likelihood $p(D|\theta)$ calculated for each substrate, and alignment was performed based on that. FIGS. 7A and 7B show the X component (ShiftX) and the Y component (ShiftY) of an alignment error of each substrate, respectively. FIGS. 7A and 7B also show, as a comparative example (conventional technique) to this embodiment, a result of setting the number of sample shot regions to 8 and performing alignment using a first-order polynomial model. FIG. 7C shows the average of alignment errors in this embodiment and the average of alignment errors in the comparative example. Referring to FIG. 7C, it is found that in this embodiment, the alignment accuracy is improved as compared to the comparative example.

A method of manufacturing an article according to the embodiment of the present invention is suitable for manufacturing an article, for example, a liquid crystal display element, a semiconductor element, a flat panel display, or a MEMS. The manufacturing method includes a process of exposing, using the above-described exposure apparatus 1, a substrate to which a photoresist is applied, and a process of developing the exposed photoresist. In addition, an etching process, an ion implantation process, and the like are performed for the substrate using the pattern of the developed photoresist as a mask, thereby forming a circuit pattern on the substrate. By repeating the processes of exposure, development, etching, and the like, a circuit pattern formed by a plurality of layers is formed on the substrate. In the post-process, dicing (processing) is performed for the substrate on which the circuit pattern is formed, and chip mounting, bonding, and inspection processes are performed. The manufacturing method can also include other known processes (for example, oxidation, deposition, vapor deposition, doping, planarization, and resist removal). The method of manufacturing an article according to this embodiment is advantageous in at least one of the performance, quality, productivity, and production cost of the article, as compared to conventional methods.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2021-026641 filed on Feb. 22, 2021, which is hereby incorporated by reference herein in its entirety.

What is claimed is:

1. A method of obtaining an array of a plurality of regions on a substrate, comprising:
    obtaining, using a prior distribution representing a probability distribution of parameters of a regression model used to estimate the array, a first posterior distribution representing the probability distribution of the parameters from first position measurement data of marks assigned to a first number of sample regions in the plurality of regions on a first substrate;
    obtaining, using the first posterior distribution as the prior distribution representing the probability distribution of the parameters, a second posterior distribution representing the probability distribution of the parameters from second position measurement data of marks assigned to a second number of sample regions in a plurality of regions on a second substrate to be processed after the first substrate, the second number being smaller than the first number; and updating the regression model by deciding the parameters based on the second posterior distribution and obtaining, using the updated regression model, the array of the plurality of regions on the second substrate from the second position measurement data.

2. The method according to claim 1, wherein the regression model includes a polynomial model including a position of the substrate as an explanatory variable.

3. The method according to claim 1, wherein in the obtaining the first posterior distribution, the first posterior distribution is obtained by the Bayes' theorem using a non-informative prior distribution that is the prior distribution and first likelihood data obtained from the first position measurement data and the regression model.

4. The method according to claim 3, wherein the non-informative prior distribution includes a uniform distribution, a normal distribution, and a Jeffreys prior distribution.

5. The method according to claim 1, wherein in the obtaining the second posterior distribution, the second posterior distribution is obtained by the Bayes' theorem using the first posterior distribution and second likelihood data obtained from the second position measurement data and the regression model.

6. The method according to claim 1, wherein the prior distribution representing the probability distribution of the parameters includes a multivariate normal distribution.

7. The method according to claim 1, wherein the prior distribution representing the probability distribution of the parameters includes a plurality of multivariate normal distributions in which variance-covariance matrices are different.

8. The method according to claim 1, wherein in the obtaining the second posterior distribution, the second posterior distribution is obtained by a Markov Chain Monte Carlo method.

9. The method according to claim 1, wherein using a multivariate normal distribution, in which a mean vector is $\mu_0$, and a variance-covariance matrix is $\Sigma_0$, as the prior distribution representing the probability distribution of the parameters, and letting y be the second position measurement data, $\sigma$ be an error variance of the second position measurement data, and G be a design matrix, a mean vector $\mu$ and a variance-covariance matrix $\Sigma$ of the second posterior distribution are obtained by $$\Sigma^{-1} = \frac{1}{\sigma^2} G^T G + \Sigma_0^{-1} \quad \mu = \Sigma \left( \frac{1}{\sigma^2} G^T y + \Sigma_0^{-1} \mu_0 \right)$$

10. The method according to claim 1, wherein in the updating the regression model, the parameters are estimated based on one of a mode, an average value, and a median of the second posterior distribution, thereby deciding the parameters and updating the regression model.

11. A method of manufacturing an article, comprising:
obtaining an array of a plurality of regions on a substrate using a method defined in claim 1;
positioning the substrate based on the array;
exposing the positioned substrate;
developing the exposed substrate; and
manufacturing the article from the developed substrate.

12. An exposure apparatus for exposing a plurality of regions on a substrate via an original, comprising:

a processing unit configured to obtain an array of the plurality of regions on the substrate; and
a stage configured to position the substrate based on the array obtained by the processing unit,
wherein the processing unit
obtains, using a prior distribution representing a probability distribution of parameters of a regression model used to estimate the array, a first posterior distribution representing the probability distribution of the parameters from first position measurement data of marks assigned to a first number of sample regions in the plurality of regions on a first substrate;
obtains, using the first posterior distribution as the prior distribution representing the probability distribution of the parameters, a second posterior distribution representing the probability distribution of the parameters from second position measurement data of marks assigned to a second number of sample regions in a plurality of regions on a second substrate to be processed after the first substrate, the second number being smaller than the first number; and
updates the regression model by deciding the parameters based on the second posterior distribution and obtains, using the updated regression model, the array of the plurality of regions on the second substrate from the second position measurement data.

13. A non-transitory storage medium storing a program configured to cause a computer to execute a method of obtaining an array of a plurality of regions on a substrate, the program causing the computer to execute:
obtaining, using a prior distribution representing a probability distribution of parameters of a regression model used to estimate the array, a first posterior distribution representing the probability distribution of the parameters from first position measurement data of marks assigned to a first number of sample regions in the plurality of regions on a first substrate;
obtaining, using the first posterior distribution as the prior distribution representing the probability distribution of the parameters, a second posterior distribution representing the probability distribution of the parameters from second position measurement data of marks assigned to a second number of sample regions in a plurality of regions on a second substrate to be processed after the first substrate, the second number being smaller than the first number; and
updating the regression model by deciding the parameters based on the second posterior distribution and obtaining, using the updated regression model, the array of the plurality of regions on the second substrate from the second position measurement data.

14. An information processing apparatus comprising a processing unit configured to execute processing of obtaining an array of a plurality of regions on a substrate,
wherein the processing unit
obtains, using a prior distribution representing a probability distribution of parameters of a regression model used to estimate the array, a first posterior distribution representing the probability distribution of the parameters from first position measurement data of marks assigned to a first number of sample regions in the plurality of regions on a first substrate;
obtains, using the first posterior distribution as the prior distribution representing the probability distribution of the parameters, a second posterior distribution representing the probability distribution of the parameters from second position measurement data of marks assigned to a second number of sample regions in a plurality of regions on a second substrate to be processed after the first substrate, the second number being smaller than the first number; and updates the regression model by deciding the parameters based on the second posterior distribution and obtains, using the updated regression model, the array of the plurality of regions on the second substrate from the second position measurement data.

\* \* \* \* \*